United States Patent [19]

Tsuji et al.

[11] Patent Number: 5,471,068
[45] Date of Patent: Nov. 28, 1995

[54] SEMICONDUCTOR PHOTODETECTOR USING AVALANCHE MULTIPLICATION AND STRAINED LAYERS

[75] Inventors: Masayoshi Tsuji; Kikuo Makita, both of Tokyo, Japan

[73] Assignee: NEC Corporation, Japan

[21] Appl. No.: 203,869

[22] Filed: Feb. 28, 1994

Related U.S. Application Data

[63] Continuation of Ser. No. 856,499, Mar. 24, 1992, abandoned.

[30] Foreign Application Priority Data

| Mar. 28, 1991 | [JP] | Japan | 3-064267 |
| Jun. 21, 1991 | [JP] | Japan | 3-149123 |
| Jun. 21, 1991 | [JP] | Japan | 3-149124 |
| Jul. 3, 1991 | [JP] | Japan | 3-163057 |

[51] Int. Cl.$^6$ ............ H01L 31/075; H01L 31/0304
[52] U.S. Cl. .................. 257/21; 257/18; 257/186
[58] Field of Search .................. 257/18, 21, 186

[56] References Cited

U.S. PATENT DOCUMENTS

| 4,952,792 | 8/1990 | Caridi | 257/18 |
| 5,187,553 | 2/1993 | Makita | 257/21 |

FOREIGN PATENT DOCUMENTS

| 60-49681 | 3/1985 | Japan | 257/21 |
| 2-90575 | 3/1990 | Japan | 257/21 |
| 2119271 | 5/1990 | Japan | 257/21 |
| 2254770 | 10/1990 | Japan | 257/21 |

OTHER PUBLICATIONS

Capasso et al. *Appl. Phys. Lett* 40(1), 1 Jan. 1982 "Enhancement . . . ratio" pp. 38–40.

Taguchi et al. *IEEE Elec. Dev. Lett* vol. EDL-7, No. 4 Apr. 1986, "Planar InP/InGaAs . . . Ring" pp. 257–258.

Forrest et al. *IEEE Elec. Dev Lett.* vol. EDL-2, No. 11, Nov. 1981 "Low Dark-Current . . . Photodiodes" pp. 283–285.

Kurtz et al., *IEEE Elec. Dev. Lett* vol. 11, No. 1, Jan. 1990 "High Defectivity . . . Detector" pp. 54–56.

Gershomi et al. *Applied Physics Lett.* vol. 53 No. 14 3 Oct. 1988 pp. 1294–1296.

Kuo et al. *J. Appl. Phys* 57(12), 15 Jun. 1985 "Effect of Mismatch Strain . . ." pp. 5428–5432.

Wang et al. *J. Appl Phys* 67(1) 1 Jan. 1990 "Strain effects . . ." pp. 344–352.

*Primary Examiner*—Jerome Jackson
*Attorney, Agent, or Firm*—Laff, Whitesel, Conte & Saret, Ltd.

[57] ABSTRACT

On a p-type InP substrate 12, there are provided a p-type InGaAs light absorptive layer 14 and an InAlAs/InGaAs superlattice avalanche multiplier layer 15. By selecting the composition of the well layer and the barrier layer of the avalanche multiplier layer 15, a strain is applied to at least one of them so that the difference $\Delta E_c$ between the energies at the lower end of the conduction band of the well layer and/or the barrier layer is increased, or the difference $\Delta E_v$ between the energies at the upper end of the valence band of the well layer and/or the barrier layer is decreased, and/or the effective mass of the hole within the well layer and/or barrier layer is decreased. Thus, the ionization factor ratio is further improved, or the pile-up of the hole is alleviated, or the traveling time of the hole is shortened to achieve an avalanche multiplier semiconductor photodetector having a wide bandwidth, low noise and high response characteristic.

15 Claims, 10 Drawing Sheets

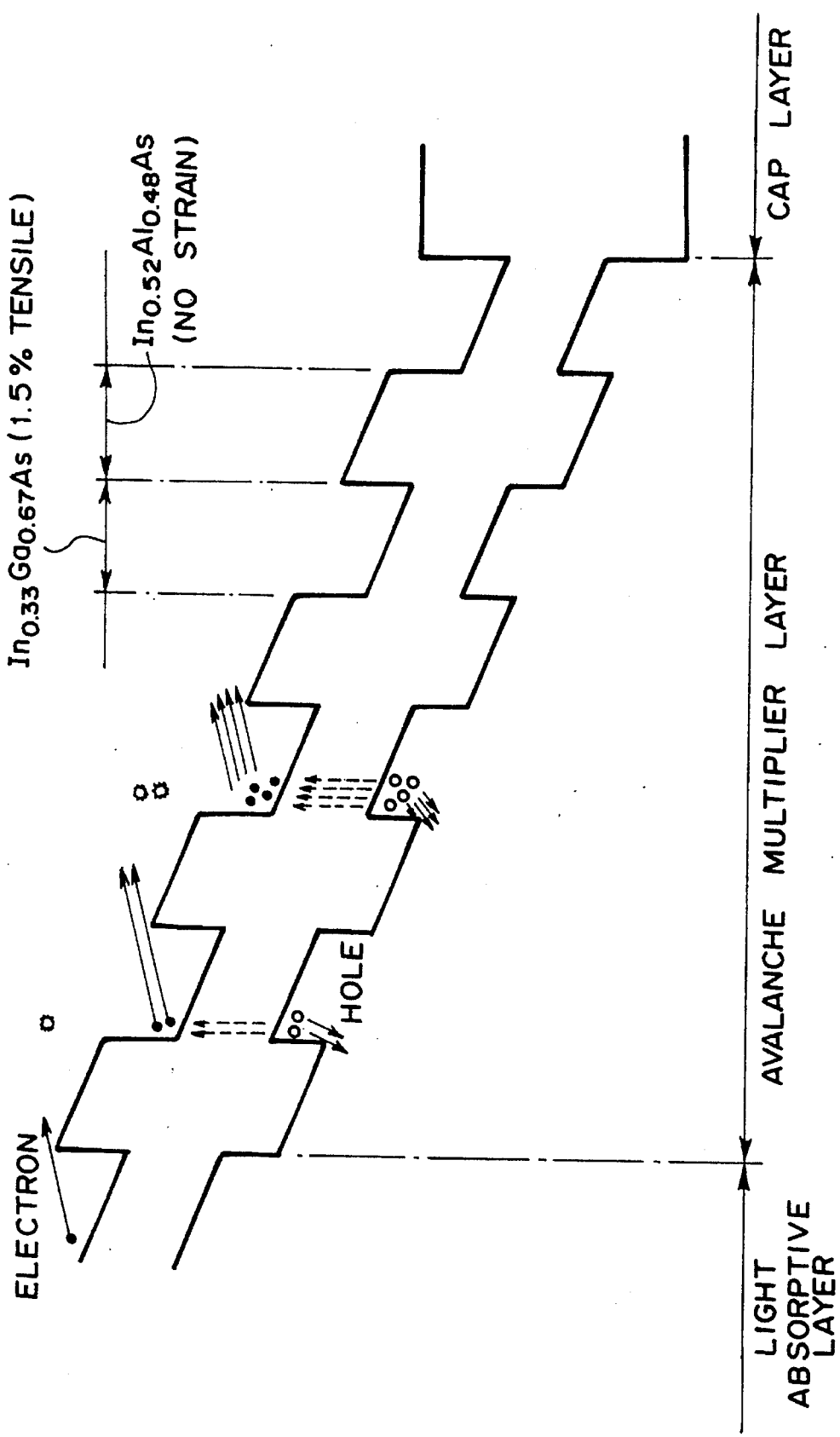

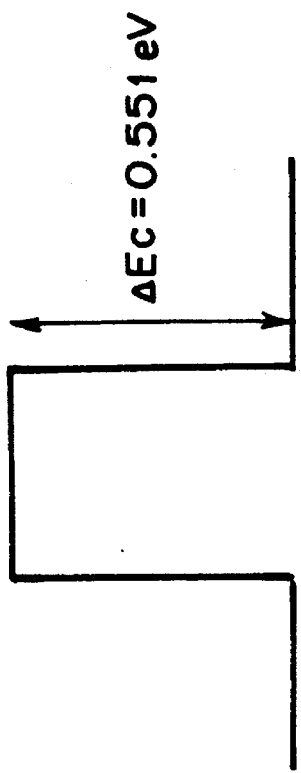
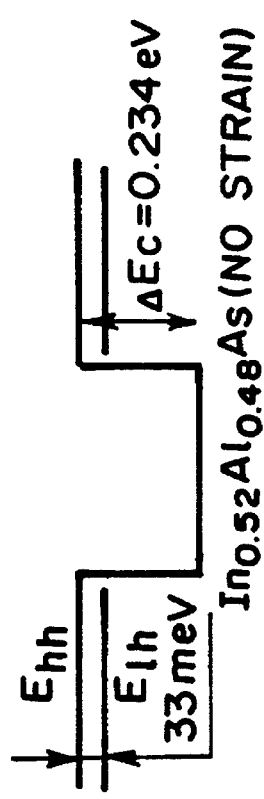
FIG. 4(b)
ΔEc=0.551eV
ΔEc=0.234eV  In$_{0.52}$Al$_{0.48}$As (NO STRAIN)
E$_{hh}$
E$_{lh}$ 33meV
In$_{0.61}$Ga$_{0.39}$As (0.5% COMPRESSIVE)
(m$_{hh}$ = 0.426 m$_0$)
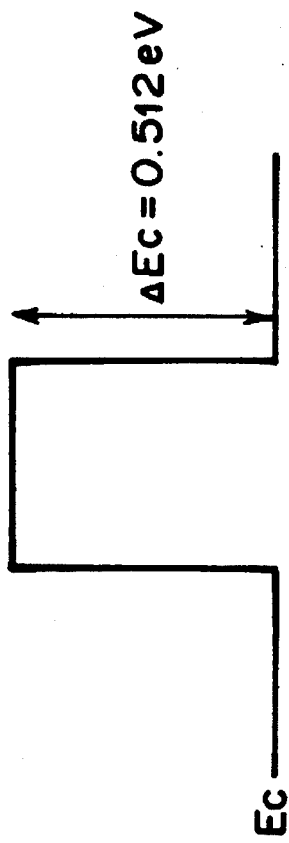
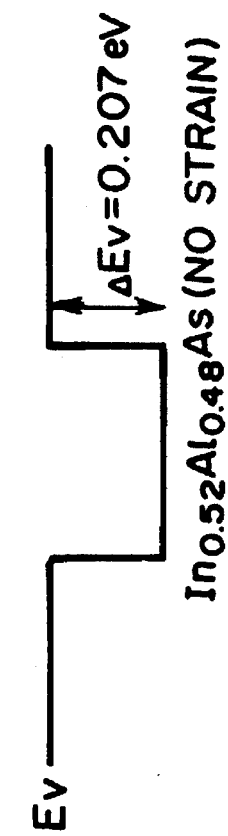
FIG. 4(a)
ΔEc=0.512eV
ΔEv=0.207eV  In$_{0.52}$Al$_{0.48}$As (NO STRAIN)
Ec
Ev
In$_{0.53}$Ga$_{0.47}$As (NO STRAIN)
(m$_{hh}$ = 0.429 m$_0$)

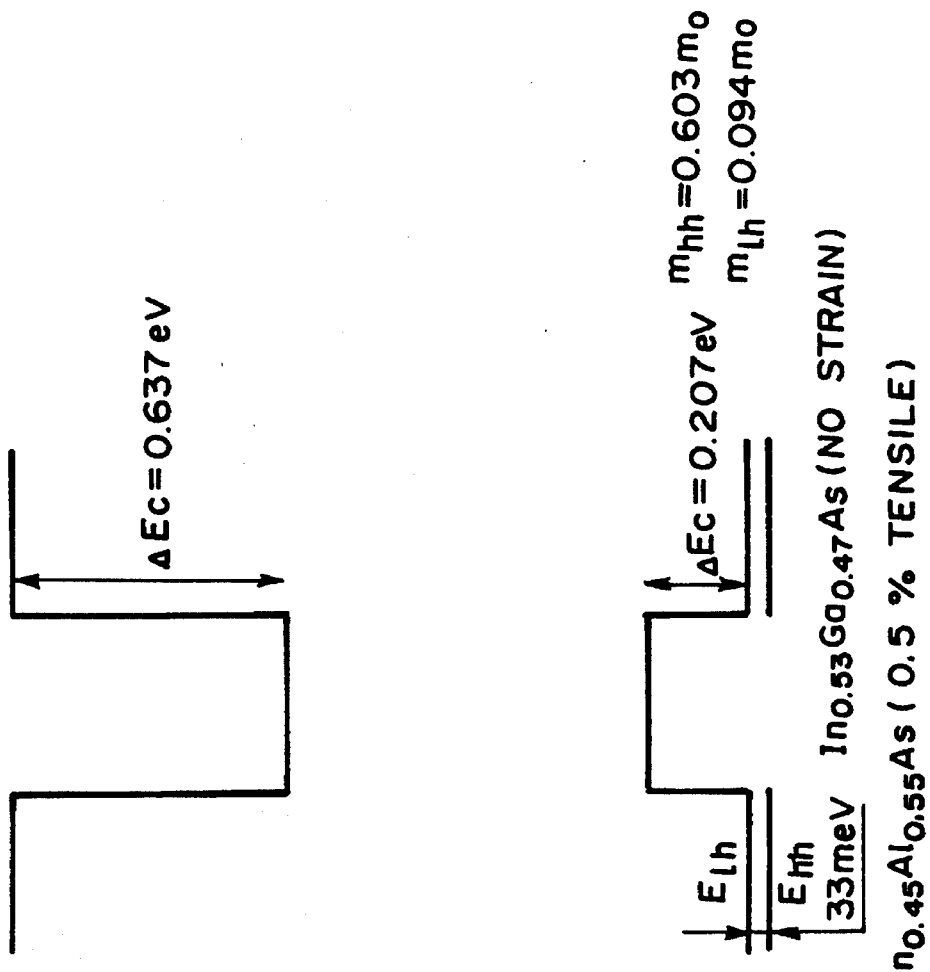
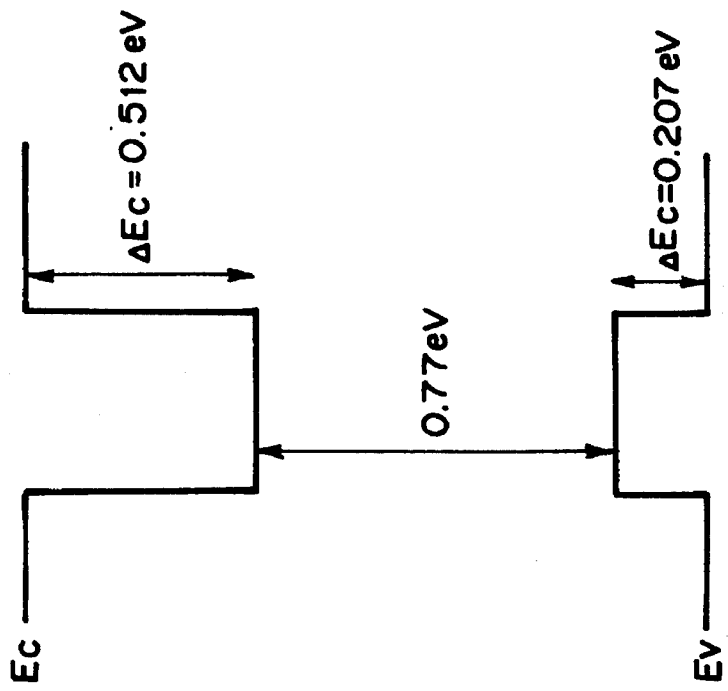

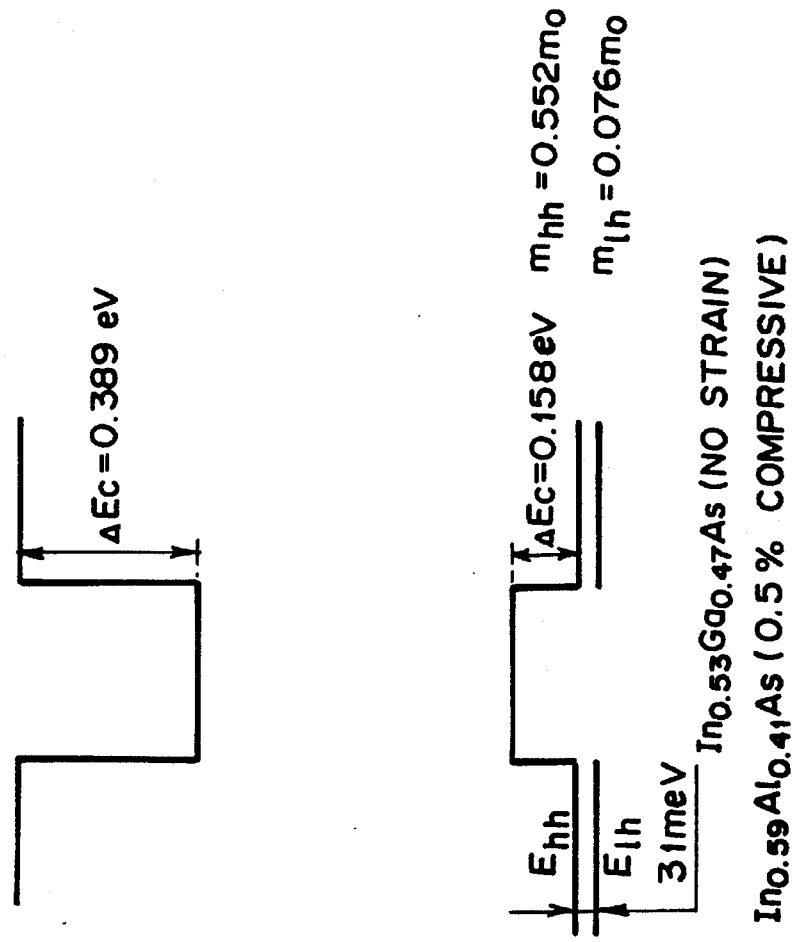
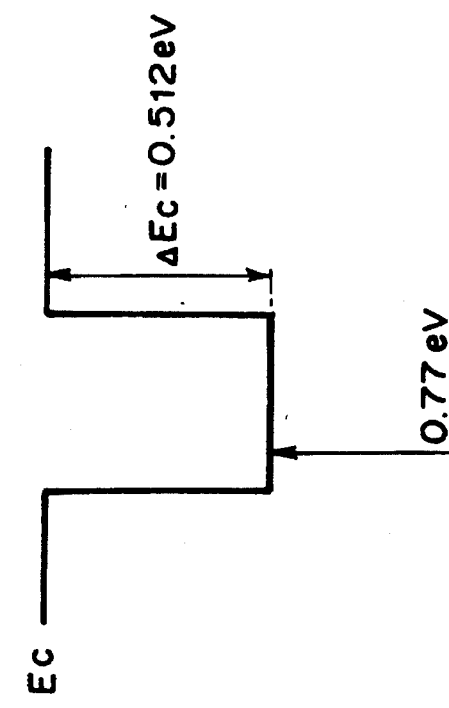

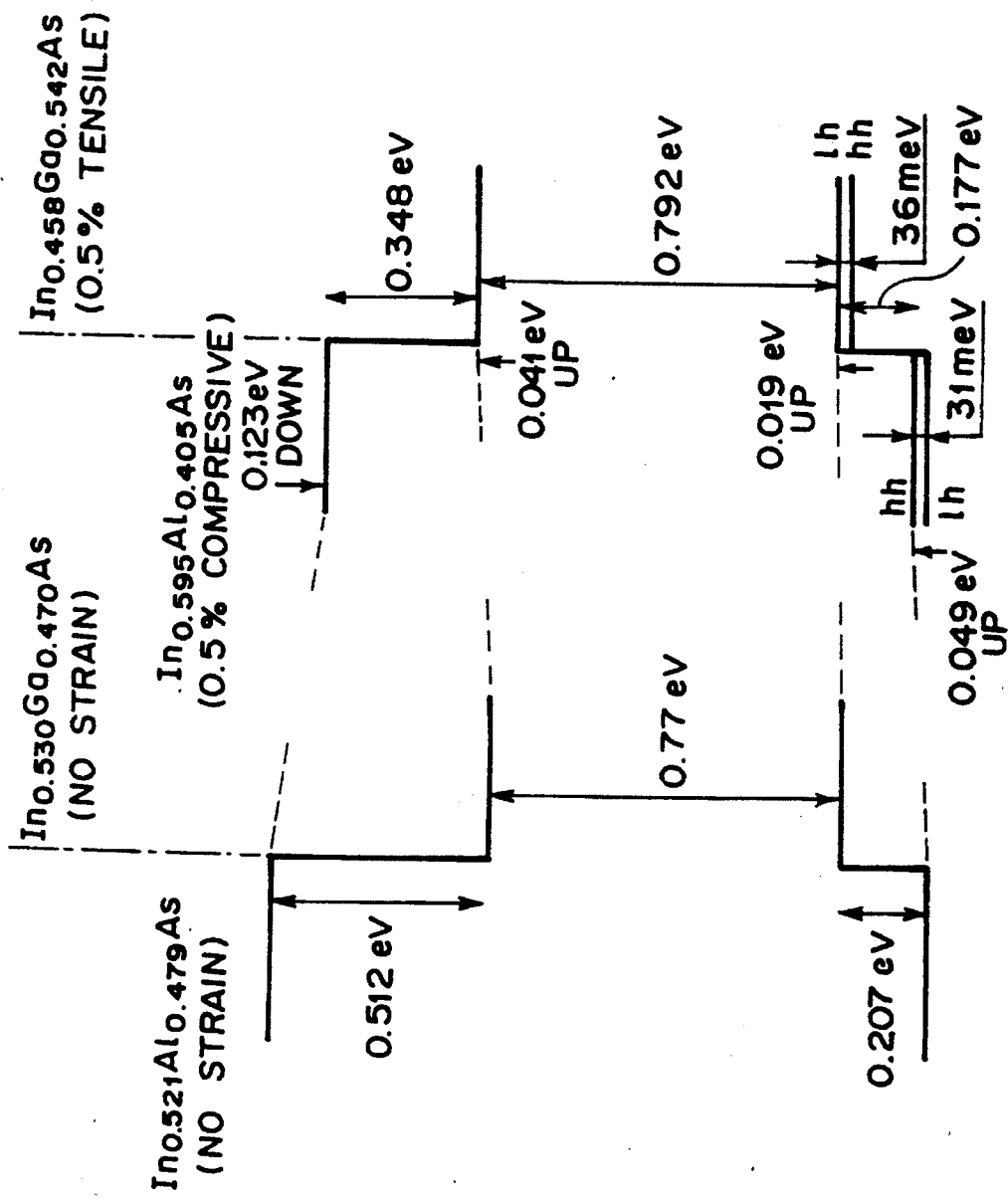

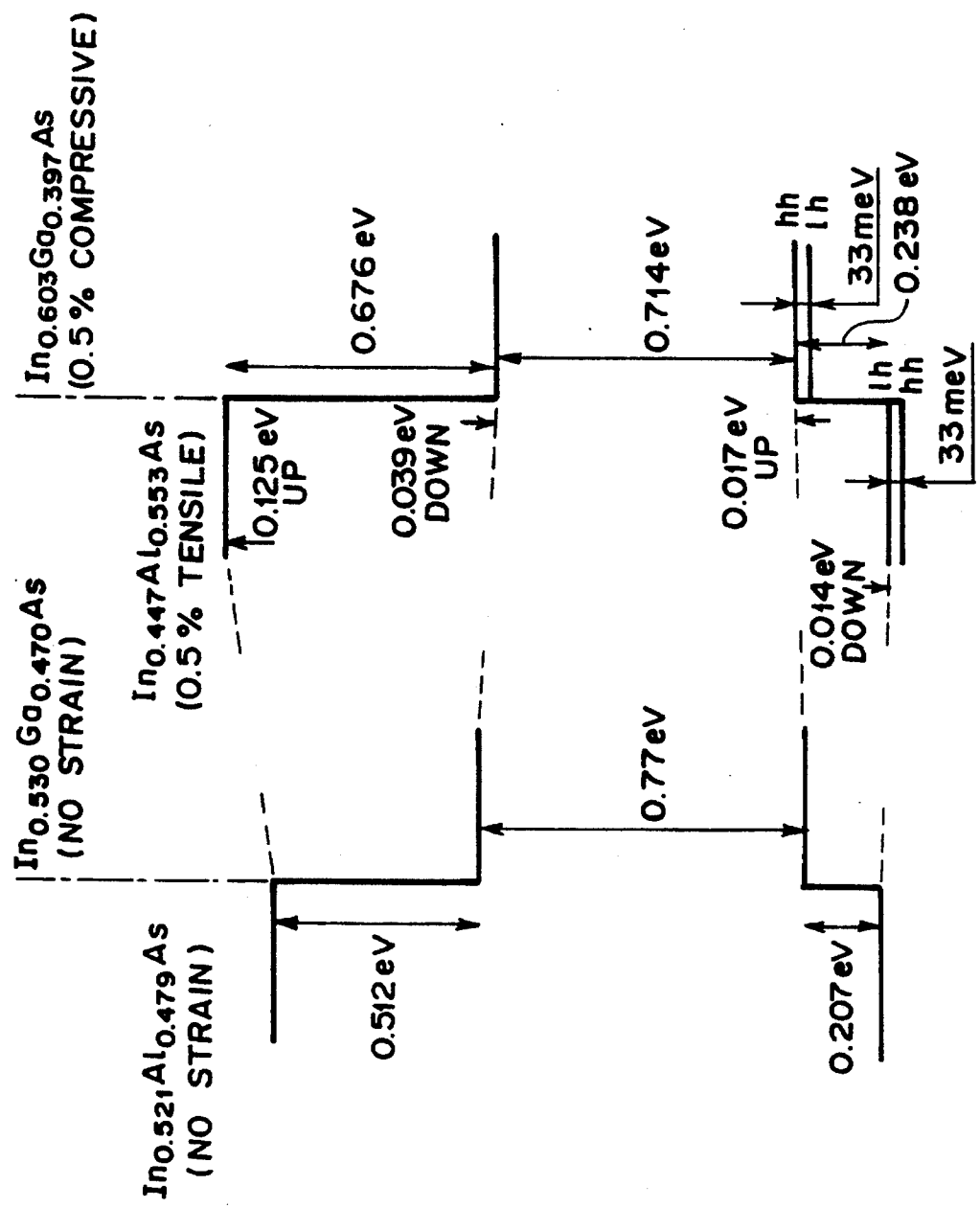

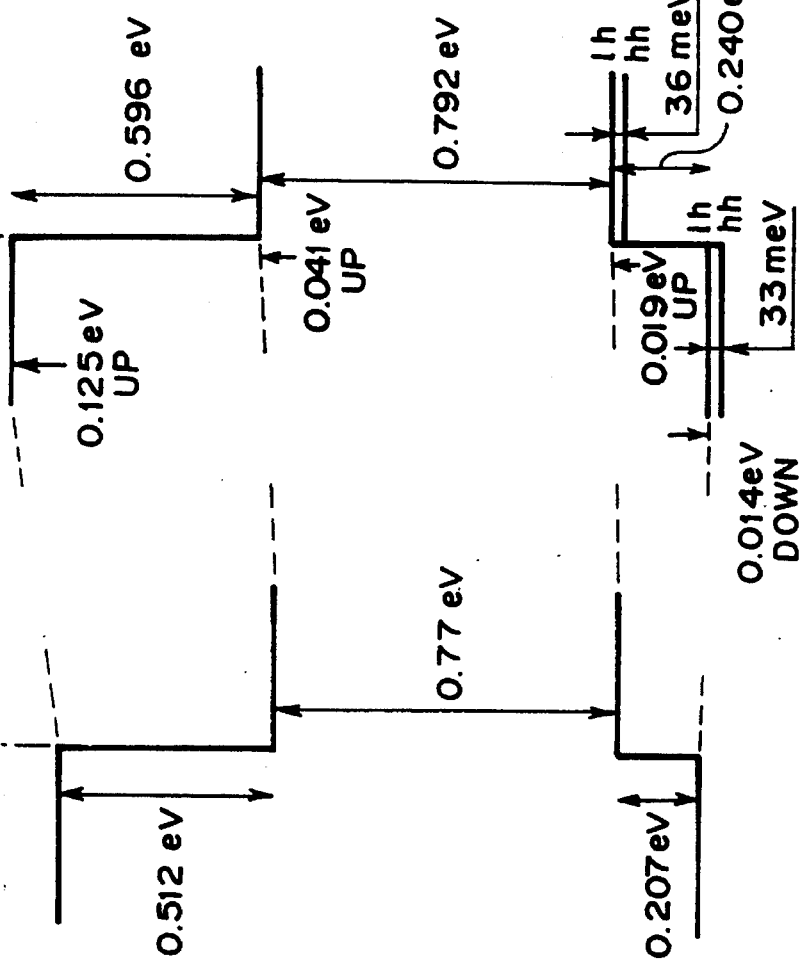

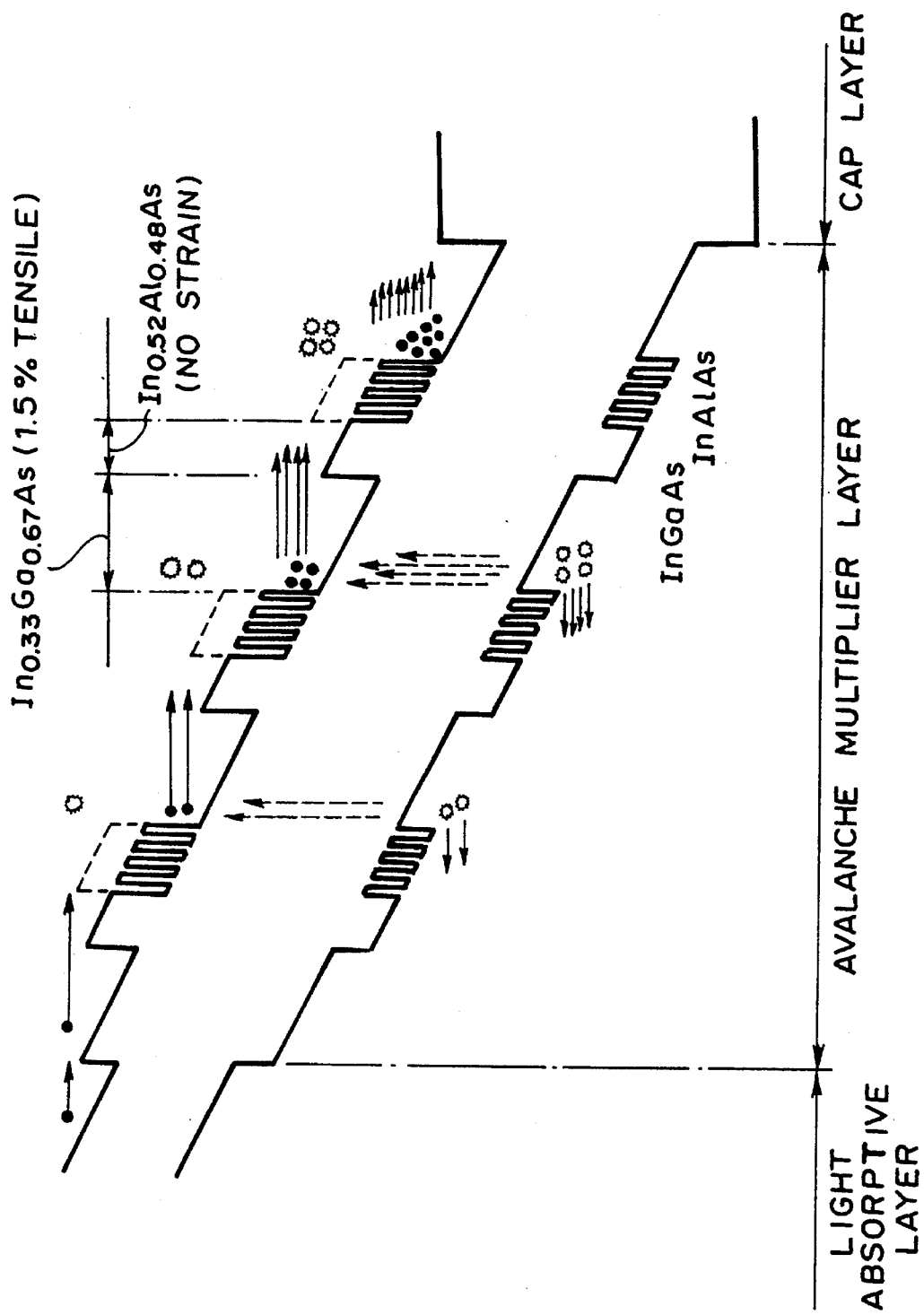

SEMICONDUCTOR PHOTODETECTOR USING AVALANCHE MULTIPLICATION AND STRAINED LAYERS

This application is a continuation, of application Ser. No. 07/856,499, filed Mar. 24, 1992, now abandoned.

FIELD OF THE INVENTION

The present invention relates to a semiconductor photodetector used in optical communication, optical data processing, optical measurement or the like, and particularly to an avalanche photodiode which is highly sensitive over a wide range of bandwidth and which suffers little noise while exhibiting a high speed response.

BACKGROUND OF THE INVENTION

Conventionally, as a semiconductor photodetector used for optical communication which is effective over a range of wavelengths of 1 through 1.6 μm, there has been known a PIN photodiode (IEEE Electron Device Letters, pages 283 through 285, Vol. EDL-2, 1981) or an avalanche photodiode (IEEE Electron Device Letters, pages 257 through 258, Vol. EDL-7, 1986), in which an InGaAs layer (for example, $In_{0.53}Ga_{0.47}As$ layer) disposed on an InP substrate so as to align in lattices is served as a light absorptive layer. In particular, the latter has been in practical use for long-distance communication because it can exhibit an internal gain effect and a high speed response resulting from the avalanche multiplier effect.

FIG. 1 illustrates a cross-sectional view of a typical InGaAs avalanche photodiode. An avalanche photodiode will be hereinafter referred to as APD. Formed on an n-type InP substrate 1 are an n-type InP buffer layer 2, an n-type InGaAs light absorptive layer 3, an n-type InP avalanche multiplier layer 4, an n-type InP cap layer 5, a p-type light receptor area 6, a p-type guard ring region 7 and a passivation film 8. In addition, a p-side electrode 9 is connected to the light receptor area 6 while an n-side electrode 10 is connected to the substrate 1.

According to this APD operating principle, among the photo-carriers generated at the InGaAs light absorptive layer 3, holes are injected into the InP avalanche multiplier layer 4. Since a high voltage is applied to the InP avalanche multiplier layer 4, an ionizing collision takes place there resulting in a multiplying characteristic. In this case, it is known that the noise and response characteristics, which are important from the point of the element characteristics, are governed by the random ionizing process of the carriers in the process of multiplication. To be concrete, the greater the difference between the ionization factor of the electron and that of the hole at the InP layer, which is the multiplier layer, is, the greater the ratio therebetween can be taken (assuming that the ionization factors of the electron and the hole be each $\alpha$ and $\beta$, if $\alpha/\beta>1$ then the electron corresponds to the main carrier which causes the ionizing collision, and if otherwise, then the hole serves as the main carrier for carrying out the ionizing collision), which is desirable from the point of the element characteristics.

However, the ratio between the ionization factors ($\alpha/\beta$ or $\beta/\alpha$) is determined in terms of the physical property of the material used, and is equal to $\beta/\alpha=2$, at most, for InP. This is remarkably small as compared with the $\alpha/\beta=20$ for Si having a low noise characteristic. Therefore, in order to realize a further lower noise characteristic and a higher response characteristic, some epoch-making material technology is called for.

In connection with this, F. Capasso et al proposed a superlattice APD which aims at achieving the high sensitivity and a wide range of bandwidth through the increase of the ratio $\alpha/\beta$ by utilizing the discontinuity (discontinuity value $\Delta Ec$) of the energies at the lower end of the conduction band to promote the ionization of the electron. The same example is described in Applied Physics Letters (Pages 38 through 40, Vol. 40, 1982). On the other hand, not in connection with APD, it is also known that the band structure can be changed by applying a stress to the superlattice structure of the semiconductor and, in particular, the degeneration of the energy level of the heavy and light holes is released in the valence band. The same example is described in Journal of Applied Physics (pages 344 through 352, Vol. 67, 1990).

As described above, in the superlattice APD, $\Delta Ec$ greatly lends itself to the improvement of the ratio between the ionization factors. However, in the superlattice APD, at the same time, the holes are piled up, and the bandwidth is suppressed due to the discontinuity (discontinuity value $\Delta Ev$) of the energies at the upper end of the valence band.

SUMMARY OF THE INVENTION

Accordingly, an object of the present invention is to solve the foregoing problem and to provide an APD which is effective over a wide range of bandwidth and is low in noise while having a high response. More specifically, an object of the present invention is to provide an APD which is effective over a wide range of bandwidth and low in noise while having a high response by further increasing $\Delta Ec$ to further increase the ratio between the ionization factors, or by decreasing $\Delta Ev$ to alleviate the pile-up of the holes, or by taking the energy level of the light hole as the ground level to reduce the effective mass of the hole so that the traveling time of the hole is shortened while the pile-up of the holes, which is caused by $\Delta Ev$, is alleviated.

According to the present, invention, in order to achieve the above-described end, there is provided a semiconductor photodetector having at least, a light absorptive layer and a superlattice avalanche multiplier layer on a semiconductor substrate in which the superlattice avalanche multiplier layer comprises a first and second semiconductor layers and, when the mean ionizing energies of III group atoms and V group atoms for the first semiconductor layer are each assumed to be $E_A$ and $E_B$, and the average ionizing energies of III group atoms and V group atoms for the second semiconductor layer are each assumed to be $E_C$ and $E_D$, a relationship: $E_A > E_C$ subsists, and at least one of the first and second semiconductor layers presents a strain. Here, the first semiconductor layer is the well layer, and the second semiconductor layer is the barrier layer. In the present invention, further relationship: $E_B < E_D$ may subsist.

In one embodiment of the present invention, the above-described strain may increase the difference between the energy at the lower end of the conduction band of the first semiconductor layer and the energy at the lower end of the conduction band of the second semiconductor layer.

In another embodiment of the present invention, the above-described strain may lessen the difference between the energy at the upper end of the valence band of the first semiconductor layer and the energy at the upper end of the valence band of the second semiconductor layer.

In a still another embodiment of the present invention, the above-described strain may lessen the effective mass of the hole at the first and/or second semiconductor layers.

According to the present invention, as the semiconductor substrate or the first and second semiconductor layers, the III–V groups compound semiconductors may be used. For example, if InP is used for the semiconductor substrate, then, as the first semiconductor layer, InGaAs, InAlGaAs, or InGaAsP may be used and, as the second semiconductor layer, InAlAs or InP may be used. In addition, if GaAs is used as the semiconductor substrate, then, as the first semiconductor layer, GaAs may be used and, as the second semiconductor layer, AlGaAs may be used. By properly selecting the compound compositions of the first semiconductor layer and the second semiconductor layer, the crystal lattice constant of these semiconductors is properly selected so that at least one of these two semiconductor layers may have a tensile strain or a compressive strain. The magnitude of this strain can be represented by the magnitude of the deviation of the crystal lattice constant of the semiconductor layer from that of the substrate with the latter taken as a criterion. In the present invention, the magnitude of the strain is preferably more than 0.1% in order to display the strain effect of the semiconductor layer. In addition, the non-strain semiconductor layer is supposed to also include ones having a fine strain of below 0.02% which can be substantially ignored.

In one embodiment of the present invention, the above-described second semiconductor layer comprises a layer for preventing the electron from transparently passing through and a multiple quantum barrier, which is a short period superlattice structure of a quantum barrier layer and a quantum well layer. The quantum well layer may be formed of the same material as that of the first semiconductor layer, that is, the well layer.

Further, according to the present invention, in order to achieve the above-described object, a semiconductor photodetector may be presented which comprises at least a light absorptive layer and a superlattice avalanche multiplier layer on a semiconductor substrate characterized in that the superlattice avalanche multiplier layer comprises a well layer and a barrier layer, and the barrier layer comprises a layer for preventing the electron from transparently passing through and a multiple quantum barrier, the multiple quantum barrier comprising a quantum barrier layer and a quantum well layer and, assuming that the mean ionizing energy of III group atoms and the forbidden band gap for the well layer and the quantum well layer be $E_A$ and $E_{gA}$ respectively and the mean ionizing energy of III group atoms and the forbidden band gap for the layer for preventing the electron from transparently passing through and the quantum barrier layer be $E_C$ and $E_{gC}$ respectively, the following relationship subsists and at least one of these well layer and barrier layer has a strain. $E_A > E_C$ and $E_A + E_{gA} < E_C + E_{gC}$. In the semiconductor photodetector according to the present invention, the thickness of a single layer of the first semiconductor layer (that is, the well layer) and the second semiconductor layer (that is, the barrier layer) is preferably less than 1000 angstroms respectively, and the thickness of the avalanche multiplier layer is preferably less than 2 μm. In addition, the thickness of a single layer of the quantum well layer and the quantum barrier layer is preferably less than 100 angstroms respectively, and the thickness of the multiple quantum barrier is preferably less than 1000 angstroms.

BRIEF DESCRIPTION OF THE ACCOMPANYING DRAWINGS

FIGS. 3, 4a, 4b, 5a, 5b, 6a, 6b, 7a, 7b, 8a, 8b, 9a, 9b, 10 and FIG. 12 illustrate respectively the energy band structure of an APD according to the present invention.

DETAILED DESCRIPTION OF THE INVENTION

Figure 1:
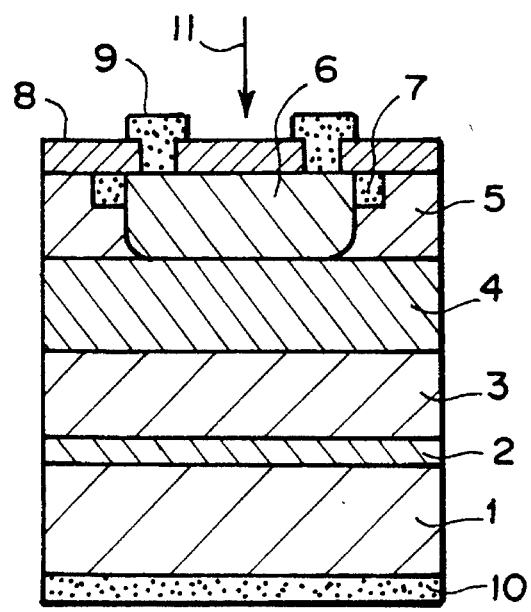
FIG. 1 is a cross-sectional view of a conventional APD.
Figure 2:
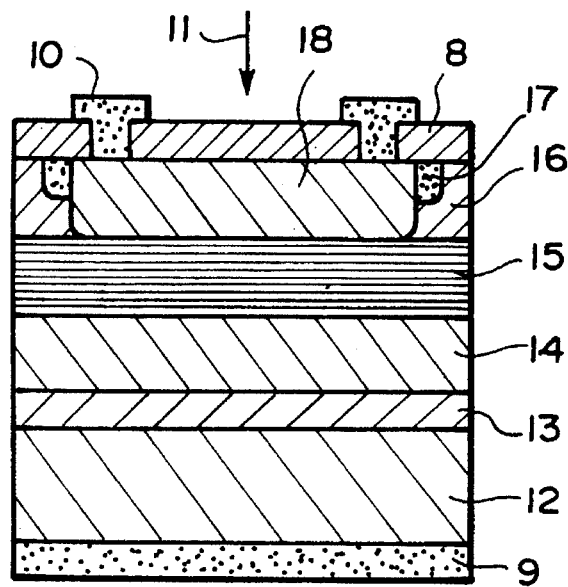
FIG. 2 is a cross-sectional view of a specific embodiment of an APD according to the present invention.

FIG. 2 illustrates a cross-sectional view of a specific embodiment of an APD according to the present invention. On a p-type InP substrate 12, a p-type InP buffer layer 13, p-type InGaAs light absorptive layer 14, p-type semiconductor superlattice avalanche multiplier layer 15, p-type InP cap layer 16, n-type guard ring region 17, $n^+$-type light receptive area 18 and a passivation film 8 are each formed. In addition, an n-side electrode 10 is connected to the light receptive area 18, and a p-side electrode 9 is connected to the substrate 12.

In the APD of the present invention, the strain of the first and second semiconductor layers of the superlattice avalanche multiplier layer 15 may be any of the tensile strain or compressive strain but, in general, they are set so that at least one of the following may be realized, that is, (1) the discontinuity value ΔEc between the energies at the lower end of the conduction band of the first and second semiconductor layers is made greater, (2) the discontinuity value ΔEv between the energies at the upper end of the valence band of the first and second semiconductor layers is made smaller, and (3) the effective mass of the hole of the first and/or second semiconductor layers is made smaller.

The semiconductor structure and, in particular, the superlattice avalanche multiplier layer 15 of the APD according to the present invention can be formed by using a growth technique such as MOVPE, MBE, gas source MBE or the like.

FIG. 3 illustrates an energy band structure of the APD according to the present invention in which the first semiconductor layer, that is, the well layer has a tensile strain, and the second semiconductor layer, that is, the barrier layer has no strain. By way of example, as the well layer, $In_xGa_{1-x}As$ ($0 \leq x \leq 1$) may be used and as the barrier layer, $In_yAl_{1-y}As$ ($0 \leq y \leq 1$) may be used. Here, x and y are selected so that the well layer has the tensile strain and the barrier layer has no strain. For example, if x=0.33 and y=0.52 then the well layer has the tensile strain of 1.5% and the barrier layer has no strain.

Among the photo carriers generated at the p-type InGaAs light absorptive layer, only the electron is injected into the avalanche multiplier layer 15 by a reversely biased electric field. Since the electron traveling through the avalanche multiplier layer senses ΔEc at the boundary between the well layer and the barrier layer, and the corresponding ionizing energy can be obtained, a major ionization factor ratio α/β can be obtained. On the other hand, since the well layer has the tensile strain, the mass of the hole traveling in the direction of the layer thickness becomes lighter than when the well layer has no strain (reported by C. P. Kuo et al in Journal of Applied Physics, pages 5428 through 5432, Vol. 57, 1985). As a result, since the traveling time of the hole through the well layer can be shortened, and the pile-up of the holes, which is caused by ΔEv, is alleviated, a wide bandwidth and low noise photodetector can be achieved.

FIG. 4, (b) illustrates an energy band structure of the APD according to the present invention in which the first semiconductor layer, that is, the well layer has the compressive strain and the second semiconductor layer, that is, the barrier layer has no strain. By way of example, as the well layer, $In_xGa_{1-x}As$ ($0 \leq x \leq 1$) can be used and, as the barrier layer, $In_yAl_{1-y}As$ ($0 \leq y \leq 1$) can be used. Here, x and y are selected so that the well layer has the compressive strain and the barrier layer has no strain. For example, if x=0.61 and y=0.52, then the well layer has the compressive strain of 0.5% and the barrier layer has no strain. Incidentally, for the sake of comparison, FIG. 4, (a) illustrates an energy band structure of the APD in which both the well layer and the barrier layer have no strain with x=0.53 and y=0.52.

Since the electron traveling through the avalanche multiplier layer 15 can sense ΔEc at the boundary between the well layer and the barrier layer, and receive the corresponding ionizing energy, a major ionization factor ratio α/β can be achieved. In particular, since this APD becomes greater in ΔEc by 39 meV than one in which both the well layer and the barrier layer have no strain, the ionization factor ratio can be further increased. Such a change of the band structure should be referred to the above-described report by C. P. Kuo et al in Journal of Applied Physics (pages 5428 through 5432, Vol. 57, 1985) and the report by T. Y. Wang et al in Journal of Applied Physics (pages 344 through 352, Vol. 67, 1990). In addition, if the well layer has the compressive strain of 0.5%, as described above, then the degeneration of the energy level of the light and heavy holes is released, and the heavy hole becomes dominant. However, since its composition is rich in In, the mass $m_{hh}=0.426\ m_o$ ($m_o$ denotes the mass of the free electron within vacuum) of the heavy hole which travels through the well layer becomes lighter by about 0.7% than the mass $m_{hh}=0.429\ m_o$ when the well layer has no strain. As a result, since the traveling time of the hole though the well layer can be shortened and the pile-up of the holes, which is caused by ΔEv, can be alleviated, the photodetector of wide bandwidth and low noise can be achieved.

FIG. 5, (b) illustrates an energy band structure of the APD according to the present invention in which the first semiconductor layer, that is, the well layer has no strain, and the second semiconductor layer, that is, the barrier layer has a tensile strain. By way of example, as the well layer, $In_xGa_{1-x}As$ ($0 \leq x \leq 1$) can be used and, as the barrier layer, $In_yAl_{1-y}As$ ($0 \leq y \leq 1$) can be used. Here, x and y are each selected so that the well layer has no strain and the barrier layer has the tensile strain. For example, if x=0.53 and y=0.45 then the well layer has no strain and the barrier layer has a tensile strain of 0.5%. Incidentally, for the sake of comparison, FIG. 5, (a) illustrates an energy band structure of an APD in which both the well layer and the barrier layer have no strain with x=0.53 and y=0.52.

Since the electron which travels through the avalanche multiplier layer 15 can sense ΔEc at the boundary between the well layer and the barrier layer, and receive the corresponding ionization energy, a major ionizing factor ratio α/β can be achieved. In particular, for this APD, since ΔEc becomes greater by 125 meV than the APD in which both the well layer and the barrier layer have no strain, the ionization factor ratio can be further increased. Further, when the barrier layer has a tensile strain of 0.5% as described above, the degeneration of the energy level of the light hole (mass $m_{lh}=0.094\ m_o$) and the heavy hole (mass $m_{hh}=0.603\ m_o$) is released, and the energy level of the latter becomes lower by 33 meV than that of the former. That is, for the holes of the barrier layer, the light hole having a mass about ⅙ times as large as that of the heavy hole becomes dominant with the result that the traveling time of the hole at the barrier layer can be shortened and the pile-up of the holes, which is caused by ΔEv, is alleviated so that a wide bandwidth and low noise photodetector can be obtained.

FIG. 6, (b) illustrates an energy band structure of an APD according to the present invention, in which the first semiconductor layer, that is, the well layer has no strain, and the second semiconductor layer, that is, the barrier layer has a compressive strain. By way of example, as the well layer, $In_xGa_{1-x}As$ ($0 \leq x \leq 1$) may be used and, as the barrier layer, $In_yAl_{1-y}As$ ($0 \leq y \leq 1$) may be used. Here, x and y are each selected so that the well layer has no strain and the barrier layer has a compressive strain. For example, if x=0.53 and y=0.59, the well layer has no strain and the barrier layer has a compressive strain of 0.5%. Incidentally, for the sake of comparison, FIG. 6, (a) illustrates an energy band structure of an APD in which both the well layer and the barrier layer have no strain with x=0.53 and y=0.52.

Since the electron which travels through the avalanche multiplier layer 15 can sense ΔEc at the boundary between the well layer and the barrier layer, and receive the ionizing energy corresponding to that energy amount, a major ionization factor ratio α/β can be obtained. Further, if the barrier layer has a compressive strain of 0.5%, as described above, since ΔEv becomes smaller by 49 meV than a case in which both the well layer and the barrier layer have no strain, the pile-up of the holes, which is caused by Δ Ev, is alleviated so that a photodetector of wide bandwidth and low noise can be obtained.

FIG. 7, (b) illustrates an energy band structure of an APD according to the present invention in which the first semiconductor layer, that is, the well layer has a tensile strain, and the second semiconductor layer, that is, the barrier layer has a compressive strain. By way of example, as the well layer, $In_xGa_{1-x}As$ ($0 \leq x \leq 1$) can be used and, as the barrier layer, $In_yAl_{1-y}As$ ($0 \leq y \leq 1$) can be used. Here, x and y are each selected so that the well layer has a tensile strain and the barrier layer has a compressive strain. For example, if x=0.458 and y=0.595, then the well layer has a tensile strain of 0.5% and the barrier layer has a compressive strain of 0.5%. Incidentally, for the sake of comparison, FIG. 7, (a) illustrates an energy band structure of an APD in which both the well layer and the barrier layer have no strain with x=0.530 and y=0.521.

Since the electron which travels through the avalanche multiplier layer 15 can sense $\Delta E_C$ at the boundary between the well layer and the barrier layer, and receive the corresponding ionizing energy, a major ionization factor ratio α/β can be obtained. Further if the well layer has a tensile strain of 0.5% and the barrier layer has a compressive strain of 0.5% as described above, then, since ΔEv becomes smaller by 30 meV than a case in which both the well layer and the barrier layer have no strain, the pile-up of the holes, which is caused by ΔEv, is alleviated, and a photodetector of wide bandwidth and low noise can be obtained. In addition, the degeneration of the energy level of the light and heavy holes at the well layer is released, and the energy level of the light hole becomes higher by 36 meV than that of the heavy hole (that is, the ground level is taken). As a result, the light hole becomes dominant for the holes within the well layer with the result that the traveling time of the hole at the well layer can be shortened, and the pile-up of the holes is alleviated so that a photodetector of wide bandwidth and low noise can be obtained.

Incidentally, since the strains of the well layer and the barrier layer are reverse to each other, it cannot substantially happen that these strains affect the portions other than the avalanche multiplier layer so that an excellent crystallization can be held. Further, the critical thickness of the avalanche multiplier layer becomes infinitely large in theoretical terms.

FIG. 8, (b) illustrates an energy band structure of an APD according to the present invention in which the first semiconductor layer, that is, the well layer has a compressive strain and the second semiconductor layer, that is, the barrier layer has a tensile strain. By way of example, as the well layer, $In_xGa_{1-x}As$ ($0 \leq x \leq 1$) can be used and, as the barrier layer, $In_yAl_{1-y}As$ ($0 \leq y \leq 1$) can be used. Here, x and y are each selected so that the well layer has the compressive strain and the barrier layer has the tensile strain. For example, if x=0.603 and y=0.447, then the well layer has a compressive strain of 0.5% and the barrier layer has a tensile strain of 0.5%. Incidentally, for the sake of comparison, FIG. 8, (a) illustrates an energy band structure of an APD in which both the well layer and the barrier layer have no strain with x=0.530 and y=0.521.

Since the electron which travels through the avalanche multiplier layer 15 can sense $\Delta Ec$ at the boundary between the well layer and the barrier layer, and receive the corresponding ionizing energy, a major ionization factor ratio $\alpha/\beta$ can be obtained. In particular, in this APD, since $\Delta Ec$ becomes greater by 164 meV than that of the APD in which both the well layer and the barrier layer have no strain, the ionization factor ratio can be further increased. Further, when the well layer has the compressive strain of 0.5% and the barrier layer has the tensile strain of 0.5% as described above, since the degeneration of the energy level of the light and heavy holes at the barrier layer is released, and the energy level of the light hole becomes higher than that of the heavy hole by 33 meV (that is, the ground level is taken). As a result, the light hole becomes dominant for the holes within the barrier layer with the result that the traveling time of the hole at the barrier layer can be shortened and the pile-up of the holes is alleviated to obtain a photodetector of wide bandwidth and low noise. Incidentally, since the strains of the well layer and the barrier layer are reverse to each other, it cannot substantially happen that these strains affect the portions other than the avalanche multiplier layer, and an excellent crystallization can be held. Further, the critical thickness of the avalanche multiplier layer becomes infinitely great in theoretical terms.

FIG. 9, (b) illustrates an energy band structure of an APD according to the present invention in Which the first semiconductor layer, that is, the well layer, and the second semiconductor layer, that is, the barrier layer both have a tensile strain. By way of example, as the well layer, $In_xGa_{1-x}As$ ($0 \leq x \leq 1$) can be used and, as the barrier layer, $In_yAl_{1-y}As$ ($0 \leq y \leq 1$) can be used. Here, x and y are each selected so that the well layer and the barrier layer have a tensile strain. For example, if x=0.458 and y=0.447, both the well layer and the barrier layer each have the tensile strain of 0.5%. Incidentally, for the sake of comparison, FIG. 9, (a) illustrates an energy band structure of an APD in which both the well layer and the barrier layer have no strain with x=0.530 and y=0.521.

Since the electron which travels through the avalanche multiplier layer 15 can sense $\Delta E_C$ at the boundary between the well layer and the barrier layer, and receive the corresponding ionizing energy, a major ionization factor ratio $\alpha/\beta$ can be obtained. In particular, in the APD according to the present invention, since $\Delta E_C$ becomes greater by 84 meV than that of the APD in which both the well layer and the barrier layer have no strain, the ionization factor ratio can be further increased. Further, when both the well layer and the barrier layer each have a tensile strain of 0.5% as described above, since the degeneration of the energy level of the light and heavy holes at the well layer and the barrier layer is released and the energy level of the light hole becomes higher than that of the heavy hole by 36 meV for the well layer and by 33 meV for the barrier layer respectively (that is, the ground level is taken), the light hole becomes dominant for the holes within the well layer and the barrier layer with the result that the traveling time of the hole at both the well layer and the barrier layer can be shortened, and the pile-up of the holes is alleviated to obtain a photodetector of wide bandwidth and low noise.

Figure 10:
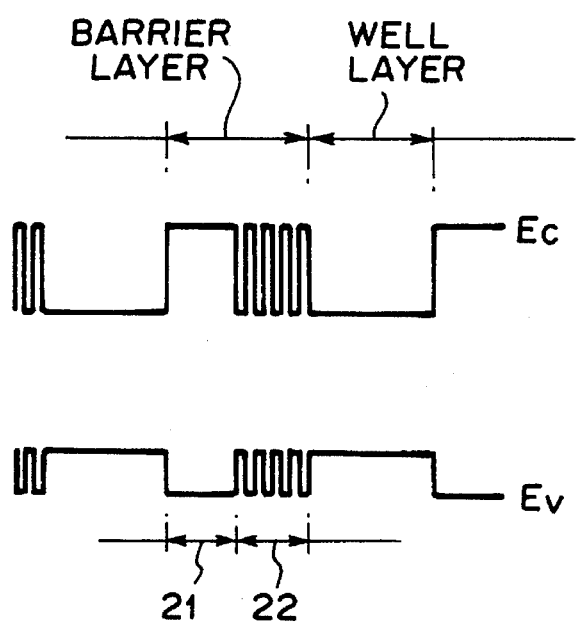

FIG. 10 illustrates an energy band structure of an APD in which the second semiconductor layer, that is, the barrier layer has a multiple quantum barrier. The barrier layer comprises a layer 21 for preventing the electron from passing through and a multiple quantum barrier 22. The multiple quantum barrier 22 comprises a quantum well layer and a quantum barrier layer. The former can be formed by using the same material as that of the first semiconductor layer, that is, the well layer, and the flatter can be formed by using the same material as that of the layer for preventing the electron from passing through.

Figure 11:
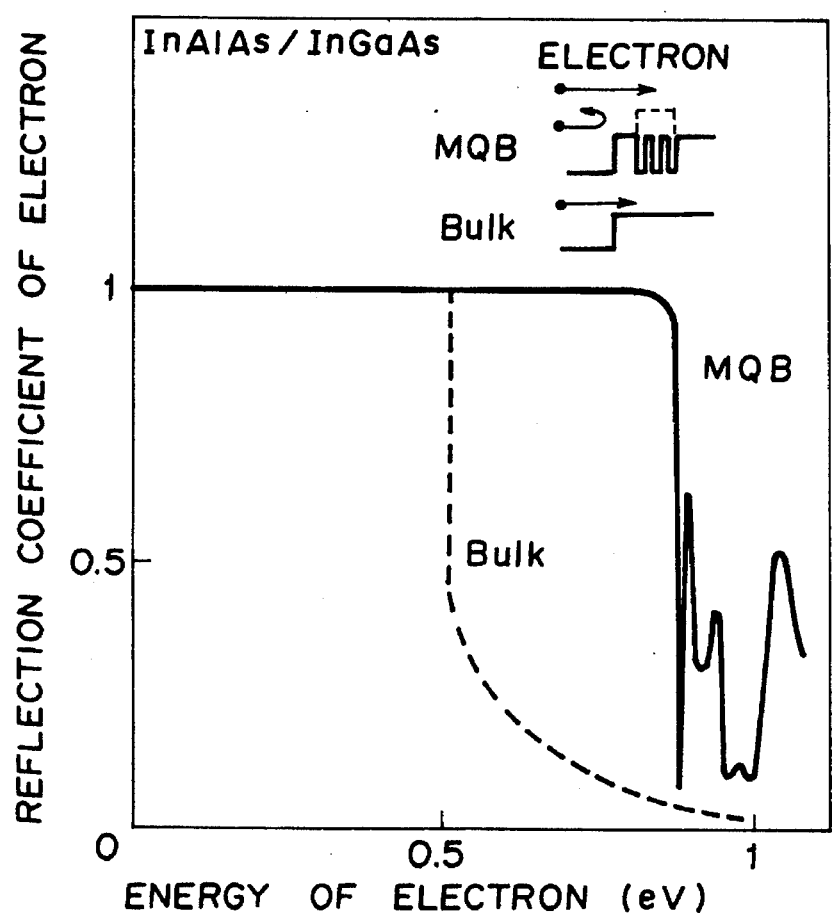
FIG. 11 describes an example of calculation of the reflection coefficient of electron for an InAlAs/InGaAs multiple quantum barrier.

FIG. 11 illustrates an example of calculation of the electron reflection coefficient of the electron for the multiple quantum barrier (MQB) when for the arrangement of FIG. 10 in which $In_xGa_{1-x}As$ ($0 \leq x \leq 1$) is used as the well layer and the quantum well layer, and $In_yAl_{1-y}As$ ($0 \leq y \leq 1$) is used for the layer for preventing the electron from passing through and the quantum barrier layer, when it is compared with the case of a bulk barrier free from the multiple quantum barrier. The electron which enters the multiple quantum barrier senses the reflection coefficient based on the interference effect even if it has an energy of above that of the quantum barrier layer. That is, it is possible to achieve an effective increase of the barrier effect. From FIG. 11 it can be found that the reflection coefficient of the electron will be increased up to about 1.7 times as large as that for the bulk barrier. The effective barrier achieving by adding this increment $\Delta E_{MQ\ B}$ is indicated by broken line in FIG. 11.

FIG. 12 illustrates an energy band structure of an APD of the present invention in which the barrier layer has the multiple guantum barrier while the well layer has a tensile strain and the barrier layer has no strain. By way of example, as the well layer, $In_xGa_{1-x}As$ ($0 \leq x \leq 1$) can be used and, as the barrier layer, $In_yAl_{1-y}As$ ($0 \leq y \leq 1$) can be used. Here, x and y are each selected so that the well layer has the tensile strain and the barrier layer has no strain. For example, if x=0.33 and y=0.52, then the well layer has a tensile strain of 1.5%, and the barrier layer has no strain.

Since the electron which travels through the avalanche multiplier layer 15 senses $\Delta E_C$ plus $\Delta E_{MQB}$ at the boundary between the well layer and the barrier layer and receives the corresponding ionizing energy, a further greater ionization factor ratio $\alpha/\beta$ can be obtained than when no multiple quantum barrier exists. Yet, the hole which travels through the valence band does not sense the multiple quantum barrier because its mass is great as compared with the electron with the result that a further multiplication of the electron can be promoted.

On the other hand, since the well layer has the tensile strain, as in the case of FIG. 3, the mass of the hole which travels in the direction of the layer thickness becomes lighter than when the well layer has no strain. As a result, since the traveling time of the hole at the well layer can be shortened, and the pile-up of the holes, which is caused by ΔEv, is alleviated, a photodetector of wide bandwidth and low noise can be obtained.

Although, here, a case was described in which the barrier layer has the multiple quantum barrier while the well layer has the tensile strain and the barrier layer has no strain, since the effect of the multiple quantum barrier can be obtained independently of the effect caused by the strain applied to at least one of the above-described well layer and the barrier layer, the present invention may be also applied to the arrangements of FIGS. 4 through 9 to similarly achieve a composite effect.

DETAILED DESCRIPTION OF THE PREFERRED EMBODIMENTS

Several embodiments of the present invention will be hereinafter described.

Embodiment 1

An APD having an arrangement as illustrated in FIG. 2 was made in the following manner.

That is, on a p-type InP substrate 12, 0.5 μm of a p-type InP buffer layer 13, 1.5 μm of a p-type InGaAs light absorptive layer 14 and a 16-cycle avalanche multiplier layer 15 of $In_yAl_{1-y}As$ (y=0.52) barrier layer of 500 angstroms/$In_xGa_{1-x}As$ (x=0.33) well layer of 250 angstroms were deposited. Here, $E_A$ was 4.42 eV, $E_B$ was 5.25 eV, $E_C$ was 4.02 eV and $E_D$ was 5.52 eV. As described with reference to FIG. 3, the well layer had a tensile strain of 1.5%.

Thereafter, 0.5 μm of a p-type InP cap layer 16 was deposited. In order to form an $n^-$-type guard ring region 17, Si of $1\times10^{13}$ $cm^{-2}$ was ion-implanted up to the depth of 3000 angstroms at the accelerating voltage of 100 kV to obtain an area having a density of $5\times10^{16}$ $cm^{-3}$. Likewise, in order to form an $n^+$-type light receptive area 18, Si of $1\times10^{14}$ $cm^{-2}$ was ion-implanted up to the depth of 0.5 μm at the accelerating voltage of 200 kV to obtain an area having a density of $1\times10^{18}$ $cm^{-3}$. Further, 1500 angstroms of a passivation film was formed and, as an n-side electrode 10, 1500 angstroms of AuGe/Ni and 500 angstroms of TiPtAu were deposited. In addition, as a p-side electrode 9, 1500 angstroms of AuZn was deposited.

In an APD thus made, a wide bandwidth, low noise and high response characteristic was obtained having an ionization factor ratio (α/β) of 50, a maximum cut-off frequency of 8 GHz and a quantum efficiency of 80%.

Embodiment 2

Except that, as the avalanche multiplier layer 15, one comprising 16 cycles of an $In_yAl_{1-y}As$ (y=0.52) barrier layer 400 angstroms/$In_xGa_{1-x}As$ (x=0.61) well layer 200 angstroms was formed, an APD having the arrangement as shown in FIG. 2 was made in the same manner as in the above-described embodiment 1. In this APD, $E_A$ was 4.57 eV, $E_B$ was 5.28 eV, $E_C$ was 4.02 eV and $E_D$ was 5.51 eV. As described with reference to FIG. 4, the well layer of this APD had a compressive strain of 0.5%.

In the APD thus made, a wide bandwidth, low noise and high response characteristic was obtained having an ionization factor ratio (α/β) of 45, a maximum cut-off frequency of 12 GHz and a quantum efficiency of 75%.

Embodiment 3

Except that, as the avalanche multiplier layer 15, one having 16 cycles of the $In_yAl_{1-y}As$ (y=0.45) barrier layer 400 angstroms/$In_xGa_{1-x}As$ (x=0.53) well layer 200 angstroms was formed, an APD) having the arrangement as shown in FIG. 2 was made in the same manner as in the above-described embodiment 1. In this APD, $E_A$ was 4.63 eV, $E_B$ was 5.41 eV, $E_C$ was 3.99 eV and $E_D$ was 5.62 eV. As described with reference to FIG. 5, the barrier layer of this APD had a tensile strain of 0.5%.

In the APD thus made, a wide bandwidth, low noise and high response characteristic was obtained having an ionization factor ratio (α/β) of 50, a maximum cut-off frequency of 12 GHz and a quantum efficiency of 70%.

Embodiment 4

Except that, as the avalanche multiplier layer 15, one comprising 16 cycles of the $In_yAl_{1-y}As$ (y=0.59) barrier layer 400 angstroms/$In_xGa_{1-x}As$ (x=0.53) well layer 200 angstroms was formed, an APD having the arrangement as shown in FIG. 2 was made in the same manner as in the above-described embodiment 1. In this APD, $E_A$ was 4.63 eV, $E_B$ was 5.41 eV, $E_C$ was 4.24 eV and $E_D$ was 5.57 eV. As described with reference to FIG. 6, the barrier layer of this APD had a compressive strain of 0.5%.

In the APD thus made, a wide bandwidth, low noise and high response characteristic was obtained having an ionization factor ratio (α/β) of 40, a maximum cut-off frequency of 13 GHz and a quantum efficiency of 70%.

Embodiment 5

Except that, as the avalanche multiplier layer 15, one having 16 cycles of an $In_yAl_{1-y}As$ (y=0.595) barrier layer 400 angstroms/$In_xGa_{1-x}As$ (x=0.458) well layer 200 angstroms was made, an APD having the arrangement as shown in FIG. 2 was made in the same manner as in the above-described embodiment 1.

In this APD, $E_A$ was 4.59 eV, $E_B$ was 5.38 eV, $E_C$ was 4.24 eV, and $E_D$ was 5.56 eV. As described with reference to FIG. 7, the well layer of this APD had a tensile strain of 0.5 % and the barrier layer had a compressive strain of 0.5%.

In the APD thus made, a wide bandwidth, low noise and high response characteristic was obtained having an ionization factor ratio (α/β) of 7, a maximum cut-off frequency of 13 GHz, a GB product of 100 GHz and a quantum efficiency of 75%.

Embodiment 6

Except that, as the avalanche multiplier layer 15, one comprising 16 cycles of an $In_yAl_{1-y}As$ (y=0.447) barrier layer of 400 angstroms/$In_xGa_{1-x}As$ (x=0.603) well layer of 200 angstroms was formed, an APD having the arrangement as shown in FIG. 2 was made in the same manner as in the above-described embodiment 1. In this APD $E_A$ was 4.67 eV, $E_B$ was 5.38 eV, $E_C$ was 4.03 eV, and $E_D$ was 5.62 eV. As described with reference to FIG. 8, the well layer of this APD had a compressive strain of 0.5%, and the barrier layer had a tensile strain of 0.5%.

In the APD thus made, a wide bandwidth, low noise and high response characteristic was obtained having an ionization factor ratio (α/β) of 10, a maximum cut-off frequency of 12 GHz, a GB product of 100 GHz and a quantum efficiency of 75%.

Embodiment 7

Except that, as the avalanche multiplier layer 15, one comprising 16 cycles of the $In_yAl_{1-y}As$ (y=0.447) barrier layer 400 angstroms/$In_xGa_{1-x}As$ (x=0.458) well layer 200 angstroms was formed, an APD) having the arrangement as shown in FIG. 2 was made in the same manner as in the above-described embodiment 1. In this APD, $E_A$ was 4.59 eV, $E_B$ was 5.38 eV, $E_C$ was 3.99 eV, and $E_D$ was 5.62 eV. As described with reference to FIG. 9, both the well layer and the barrier layer of this APD each had a tensile strain of 0.5%.

In the APD thus made, a wide bandwidth, low noise and high response characteristic was obtained having an ionization factor ratio ($\alpha/\beta$) of 10, a maximum cut-off frequency of 15 GHz, a GB product of 110 GHz and a quantum efficiency of 75%.

Embodiment 8

Except that, as the barrier layer of the avalanche multiplier layer 15, one comprising the layer of 250 angstroms for preventing the electron from passing through and the multiple quantum barrier, which comprises 5 cycles of the $Al_{1-y}As$ (y=0.52) quantum barrier layer 30 angstroms/$In_xGa_{1-x}As$ (x=0.33) quantum well layer 20 angstroms, an APD having the arrangement as shown in FIG. 2 was made in the same manner as in the above-described embodiment 1. In this APD, $E_A$ was 4.42 eV, $E_B$ was 5.25 eV, $E_C$ was 4.02 eV, $E_D$ was 5.52 eV, $E_{gA}$ was 0.83 eV and $E_{gC}$ was 1.50 eV. As described with reference to FIG. 12 the well layer of this APD had a tensile strain of 1.5%.

In the APD thus made, a wide bandwidth, low noise and high response characteristic was obtained having an ionization factor ratio ($\alpha/\beta$) of 110, a maximum cut-off frequency of 8 GHz and a quantum efficiency of 80%.

As described above, according to the semiconductor photodetector of the present invention, it is possible to increase $\Delta E_C$ to improve the ionization factor ratio, or lessen $\Delta E_v$ to alleviate the pile-up of the hole, or lighten the effective mass of the hole within the well layer and/or the barrier layer to shorten the traveling time of the hole. In addition, by using ones including the multiple quantum barrier as the avalanche multiplier layer, the effective $\Delta E\ C$ can be increased so that the ionization factor ratio can be further increased. In consequence, a semiconductor photodetector having a wide bandwidth highly sensitive, low noise and high response characteristic can be realized.

What is claimed is:

1. A semiconductor photodetector comprising at least a light absorptive layer and a superlattice avalanche multiplier layer on a semiconductor substrate, electrons generated at said light absorptive layer being injected to said superlattice avalanche multiplier layer under reverse bias, said superlattice avalanche multiplier layer comprising a first semiconductor layer and a second semiconductor layer, the second layer having a lattice structure which matches the lattice structure of the substrate to produce a minimal strain, and wherein $E_A>E_C$ and $E_B<E_D$ where the mean ionizing energies of group III atoms and group V atoms of said first semiconductor layer are $E_A$ and $E_B$, respectively, and the mean ionizing energies of group III atoms and group V atoms of said second semiconductor layer are $E_C$ and $E_D$, respectively, a discontinuity of energy of the lower end of a conduction band being present at all the boundaries of said first and second semiconductor layers, first values of said discontinuity for all the boundaries being substantially equal, and the first semiconductor layer having a tensile strain and the second semiconductor layer having substantially no strain so that an effective mass of a hole within said first semiconductor layer, which travels in a direction of layer thickness, is made lighter than an effective mass of a hole in a material identical in composition to said first semiconductor layer when under no strain.

2. A semiconductor photodetector as set forth in claim 1, wherein said second semiconductor layer comprises a layer for preventing electrons from passing there through and a multiple quantum barrier, said multiple quantum barrier being a short period superlattice structure of a quantum barrier layer and a quantum well layer and being positioned at a side from which electrons go out of the second semiconductor layer, each of said quantum barrier layer having a thickness which is less than the thickness of the layer for preventing the electrons from passing there through, each of said quantum well layer having a thickness which is less than the thickness of the first semiconductor layer.

3. A semiconductor photodetector as set forth in claim 2, wherein a discontinuity of energy at the lower end of a conduction band is present at all of the boundaries of said quantum well and quantum barrier layers with substantially equal second values of discontinuity for all of the boundaries, said second values of discontinuity being substantially equal to said first values at the boundaries of the first and second semiconductor layers.

4. A semiconductor photodetector comprising at least a light absorptive layer and a superlattice avalanche multiplier layer on a semiconductor substrate, electrons generated at said light absorptive layer being injected to said superlattice avalanche multiplier layer under reverse bias, said superlattice avalanche multiplier layer comprising a first semiconductor layer and a second semiconductor layer, said first semiconductor layer having a lattice structure which matches the lattice of the substrate to provide a minimal strain, and wherein $E_A>E_C$ and $E_B<E_D$ where the mean ionizing energies of group III atoms and group V atoms of said first semiconductor layer are $E_A$ and $E_B$, respectively, and the mean ionizing energies of group III atoms and group V atoms of said second semiconductor layer are $E_C$ and $E_D$, respectively, a discontinuity of energy of the lower end of a conduction band being present at all the boundaries of said first and second semiconductor layers, first values of said discontinuity for all the boundaries being substantially equal, and the first semiconductor layer having substantially no strain and the second semiconductor layer having a tensile strain so that an effective mass of a hole within said second semiconductor layer, which travels in a direction of layer thickness, is made lighter and the difference between the energies at the lower end of the conduction band of said first and second semiconductor layers is made greater than an effective mass of a hole and of corresponding energies in a material identical in composition to said second semiconductor layer when under no strain.

5. A semiconductor photodetector as set forth in claim 4, wherein said second semiconductor layer comprises a layer for preventing electrons from passing there through and a multiple quantum barrier, said multiple quantum barrier being a short period superlattice structure of a quantum barrier layer and a quantum well layer and being positioned at a side from which electrons go out of the second semiconductor layer, each of said quantum barrier layer having a thickness which is less than the thickness of the layer for preventing the electrons from passing there through, each of said quantum well layer having a thickness which is less than the thickness of the first semiconductor layer.

6. A semiconductor photodetector as set forth in claim 5, wherein a discontinuity of energy at the lower end of a conduction band is present at all of the boundaries of said quantum well and quantum barrier layers with substantially equal second values of discontinuity for all of the boundaries, said second values of discontinuity being substantially equal to said first values at the boundaries of the first and second semiconductor layers.

7. A semiconductor photodetector comprising at least a light absorptive layer and a superlattice avalanche multiplier layer on a semiconductor substrate, electrons generated at said light absorptive layer being injected to said superlattice avalanche multiplier layer under reverse bias, said superlattice avalanche multiplier layer comprising a first semiconductor layer and a second semiconductor layer, said first layer having a lattice structure which matches the lattice structure of the substrate to produce a minimal strain, and wherein $E_A > E_C$ and $E_B < E_D$ where the mean ionizing energies of group III atoms and group V atoms of said first semiconductor layer are $E_A$ and $E_B$, respectively, and the mean ionizing energies of group III atoms and group V atoms of said second semiconductor layer are $E_C$ and $E_D$, respectively, a discontinuity of energy of the lower end of a conduction band being present at all the boundaries of said first and second semiconductor layers, first values of said discontinuity for all the boundaries being substantially equal, and the first semiconductor layer having no strain and the second semiconductor layer having a compressive strain so that the difference between the energies at the upper end of the valence band of said first and second semiconductor layers is made smaller than corresponding energies in a material identical in composition to said second semiconductor layer when under strain.

8. A semiconductor photodetector as set forth in claim 7, wherein said second semiconductor layer comprises a layer for preventing electrons from passing there through and a multiple quantum barrier, said multiple quantum barrier being a short period superlattice structure of a quantum barrier layer and a quantum well layer and being positioned at a side from which electrons go out of the second semiconductor layer, each of said quantum barrier layer having a thickness which is less than the thickness of the layer for preventing the electrons from passing there through, each of said quantum well layer having a thickness which is less than the thickness of the first semiconductor layer.

9. A semiconductor photodetector as set forth in claim 8, wherein a discontinuity of energy at the lower end of a conduction band is present at all of the boundaries of said quantum well and quantum barrier layers with substantially equal second values of discontinuity for all of the boundaries, said second values of discontinuity being substantially equal to said first values at the boundaries of the first and second semiconductor layers.

10. A semiconductor photodetector comprising at least a light absorptive layer and a superlattice avalanche multiplier layer on a semiconductor substrate, electrons generated at said light absorptive layer being injected to said superlattice avalanche multiplier layer under reverse bias, said superlattice avalanche multiplier layer comprising a first semiconductor layer and a second semiconductor layer, said second layer having a lattice structure which matches the lattice structures of the substrate to produce minimal strain, and wherein $E_A > E_C$ and $E_B < E_D$ where the mean ionizing energies of group III atoms and group V atoms of said first semiconductor layer are $E_A$ and $E_B$, respectively, and the mean ionizing energies of group III atoms and group V atoms of said second semiconductor layer are $E_C$ and $E_D$, respectively, a discontinuity of energy of the lower end of a conduction band being present at all the boundaries of said first and second semiconductor layers, first values of said discontinuity for all the boundaries being substantially equal, and the first semiconductor layer having a tensile strain and the second semiconductor layer having a compressive strain so that an effective mass of a hole within said first semiconductor layer which travels in a direction of layer thickness is made lighter and the difference between the energies at the upper end of the valence band of said first and second semiconductor layers is made smaller than an effective mass of a hole in a material identical in composition to said first and second semiconductor layers when under no strain.

11. A semiconductor photodetector as set forth in claim 10, wherein said second semiconductor layer comprises a layer for preventing electrons from passing there through and a multiple quantum barrier, said multiple quantum barrier being a short period superlattice structure of a quantum barrier layer and a quantum well layer, and being positioned at a side from which electrons go out of the second semiconductor layer, each of said quantum barrier layer having a thickness which is less than the thickness of the layer for preventing the electrons from passing there through, each of said quantum well layer having a thickness which is less than the thickness of the first semiconductor layer.

12. A semiconductor photodetector as set forth in claim 11, wherein a discontinuity of energy at the lower end of a conduction band is present at all of the boundaries of said quantum well and quantum barrier layers with substantially equal second values of discontinuity for all of the boundaries, said second values of discontinuity being substantially equal to said first values at the boundaries of the first and second semiconductor layers.

13. A semiconductor photodetector comprising at least a light absorptive layer and a superlattice avalanche multiplier layer on a semiconductor substrate, electrons generated at said light absorptive layer being injected to said superlattice avalanche multiplier layer under reverse bias, said superlattice avalanche multiplier comprising a first semiconductor layer and a second semiconductor layer, said second layer having a lattice structure which matches the lattice structure of the substrate to provide a minimum strain, and wherein $E_A > E_C$ and $E_B < E_D$ where the mean ionizing energies of group III atoms and group V atoms of said first semiconductor layer are $E_A$ and $E_B$, respectively, and the mean ionizing energies of group III atoms and group V atoms of said second semiconductor layer are $E_C$ and $E_D$, respectively, a discontinuity of energy of the lower end of a conduction band being present at all the boundaries of said first and second semiconductor layers, first values of said discontinuity for all the boundaries being substantially equal, and the first semiconductor layer having a tensile strain and the second semiconductor layer having a tensile strain so that an effective mass of a hole within said first and second semiconductor layer which travels in a direction of layer thickness is made lighter and the difference between the energies at the lower end of the conduction band of said first and second semiconductor layers is made greater than an effective mass of a hole in and of corresponding energies of a material identical in composition to said first and second semiconductor layers when under no strain.

14. A semiconductor photodetector as set forth in claim 13, wherein said second semiconductor layer comprises a layer for preventing electrons from passing there through and a multiple quantum barrier, said multiple quantum barrier being a short period superlattice structure of a quantum barrier layer and a quantum well layer and being positioned at a side from which electrons go out of the second semiconductor layer, each of said quantum barrier layer having a thickness which is less than the thickness of the layer for preventing the electrons from passing there through, each of said quantum well layer having a thickness which is less than the thickness of the first semiconductor layer.

15. A semiconductor photodetector as set forth in claim 14, wherein a discontinuity of energy at the lower end of a conduction band is present at all of the boundaries of said quantum well and quantum barrier layers with substantially equal second values of discontinuity for all of the boundaries, said second values of discontinuity being substantially equal to said first values at the boundaries of the first and second semiconductor layers.

* * * * *